(12) United States Patent
Ranta

(10) Patent No.: US 11,973,470 B2
(45) Date of Patent: Apr. 30, 2024

(54) IMPEDANCE CONTROL IN MERGED STACKED FET AMPLIFIERS

(71) Applicant: pSemi Corporation, San Diego, CA (US)

(72) Inventor: Tero Tapio Ranta, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 453 days.

(21) Appl. No.: 17/479,320

(22) Filed: Sep. 20, 2021

(65) Prior Publication Data

US 2022/0103129 A1 Mar. 31, 2022

(30) Foreign Application Priority Data

Sep. 21, 2020 (EP) .................................. 20197129

(51) Int. Cl.
*H03F 1/22* (2006.01)
*H03F 1/56* (2006.01)
(Continued)

(52) U.S. Cl.
CPC ............. *H03F 1/223* (2013.01); *H03F 1/565* (2013.01); *H03F 3/195* (2013.01);
(Continued)

(58) Field of Classification Search
CPC .......... H03F 1/223; H03F 1/565; H03F 3/195; H03F 3/45188; H03F 3/607;
(Continued)

(56) References Cited

U.S. PATENT DOCUMENTS 5,015,968 A * 5/1991 Podell ..................... H03F 1/226
330/277
7,123,898 B2 10/2006 Burgener et al.
(Continued)

FOREIGN PATENT DOCUMENTS

| CN | 001 104901631 A | 9/2015 |
| KR | 10-2019-0034230 A | 4/2019 |
| WO | 2018/026578 A1 | 2/2018 |

OTHER PUBLICATIONS

Extended European Search Report for EP application No. 20197129.8 filed Sep. 21, 2020, dated Mar. 9, 2021, 11 pages.
(Continued)

*Primary Examiner* — Hieu P Nguyen
(74) *Attorney, Agent, or Firm* — Steinfl + Bruno LLP

(57) ABSTRACT

Methods and apparatuses for controlling impedance in intermediate nodes of a stacked FET amplifier are presented. According to one aspect, a series-connected resistive and capacitive network coupled to a gate of a cascode FET transistor of the amplifier provide control of a real part and an imaginary part of an impedance looking into a source of the transistor. According to another aspect, a second parallel-connected resistive and inductive network coupled to the first network provide further control of the real and imaginary parts of the impedance. According to another aspect, a combination of the first and/or the second networks provide control of the impedance to cancel a reactance component of the impedance. According to another aspect, such combination provides control of the real part for distribution of an RF voltage output by the amplifier across stacked FET transistors of the amplifier.

19 Claims, 15 Drawing Sheets

(51) Int. Cl.
*H03F 3/195* (2006.01)
*H03F 3/45* (2006.01)
*H03F 3/60* (2006.01)

(52) U.S. Cl.
CPC ......... *H03F 3/45188* (2013.01); *H03F 3/607* (2013.01); *H03F 2200/451* (2013.01)

(58) Field of Classification Search
CPC ........... H03F 2200/451; H03F 2200/18; H03F 2200/61; H03F 2203/45301; H03F 3/193; H03F 3/45179
USPC ............................................ 330/311, 277, 98
See application file for complete search history.

(56) References Cited

U.S. PATENT DOCUMENTS

| | | | |
|---|---|---|---|
| 7,248,120 | B2 | 7/2007 | Burgener et al. |
| 7,890,891 | B2 | 2/2011 | Stuber et al. |
| 8,427,240 | B2 * | 4/2013 | Hsieh ..................... H03F 3/195 330/311 |
| 8,742,502 | B2 | 6/2014 | Brindle et al. |
| 9,209,752 | B2 * | 12/2015 | Takenaka ................ H03F 1/223 |
| 10,680,599 | B1 | 6/2020 | Syroiezhin et al. |
| 2013/0229237 | A1 | 9/2013 | Takenaka |
| 2014/0035669 | A1 | 2/2014 | Moreira |
| 2014/0266458 | A1 | 9/2014 | Scott et al. |
| 2017/0230015 | A1 | 8/2017 | Roberg |
| 2019/0379330 | A1 | 12/2019 | Willard et al. |
| 2020/0007100 | A1 | 1/2020 | Kamozaki |

OTHER PUBLICATIONS

H. Dabag, et al., "Analysis and Design of Stacked-FET Millimeter-Wave Power Amplifiers," in IEEE Transactions on Microwave Theory and Techniques, vol. 61, No. 4, Apr. 2013. pp. 1543-1556. 14 Pages. doi: 10.1109/TMTT.2013.2247698. Available online at: https://ieeexplore.ieee.org/document/6475208.

International Search Report issued for International PCT Application No. PCT/US2021/051049 filed on Sep. 20, 2021, on behalf of pSemi Corporation, dated Jan. 10, 2022. 5 Pages.

Written Opinion issued for International PCT Application No. PCT/US2021/051049 filed on Sep. 20, 2021, on behalf of pSemi Corporation, dated Jan. 10, 2022. 8 Pages.

94(3) EPC Communication for EP application No. 20197129.8 filed Sep. 21, 2020, dated Oct. 18, 2021. 11 pages.

Extended European Search Report for EP Application No. 22192570.4 filed on Aug. 29, 2022 on behalf of Psemi Corporation dated Dec. 19, 2022 11 pages.

* cited by examiner

IMPEDANCE CONTROL IN MERGED STACKED FET AMPLIFIERS

CROSS-REFERENCE TO RELATED APPLICATIONS

The present application claims priority to European Patent Application No. 20197129.8 filed on Sep. 21, 2020, entitled "Impedance Control in Merged Stacked FET Amplifiers", which is incorporated herein by reference in its entirety.

TECHNICAL FIELD

The present teachings relate to radio frequency (RF) circuits. More particularly, the present teachings relate to methods and apparatuses for controlling impedance in intermediate nodes of stacked field-effect transistor (FETs) amplifiers, including canceling of reactance components of the impedance.

BACKGROUND

FIG. 1A shows a simplified schematic of a prior art stacked FET amplifier (100A) that can be used to amplify an RF signal, $RF_{IN}$, provided through an input impedance, $Z_S$, to a gate, G1, of an input transistor, M1, of the amplifier (100A), and output a corresponding amplified RF signal, $RF_{OUT}$, into a load, $Z_L$ that is coupled to a drain, D4, of an output (cascode) transistor, M4, of the amplifier (100A). A DC biasing circuit (150) coupled to gates (G2, G3, G4) of the cascode transistors (M2, M3, M4) via respective series-connected resistors (Rb2, Rb3, Rb4) can be used to provide biasing voltages to the gates. As shown in FIG. 1A, the stacked FET amplifier (100A) can operate between a supply voltage $V_{DD}$ coupled to the drain, D4, of the output transistor M4 via, for example, an inductor L, and a reference node, e.g., a reference ground (e.g., AC ground) coupled to the source, S1, of the input transistor M1. It should be noted that a height of the stacked FET amplifier (100A) as provided by a number of (series-connected) stacked transistors can be any integer, N, where N=2, 4, ..., 10 ..., etc., and therefore the exemplary case of N=4 shown in FIG. 1A should not be considered as limiting the present description. Furthermore, it should be noted that the present description mainly relates to AC behavior of stacked FET amplifiers and therefore the provided schematics mainly show the AC representation of such amplifiers. Accordingly, components such as the DC biasing circuit (150) and corresponding coupling resistors (e.g., Rb2, ..., Rb4) as well as the supply voltage $V_{DD}$ and coupling inductor, L, may be omitted in various figures of the present disclosure. Furthermore it should be noted that as it is well known to a person skilled in the art, the stacked FET amplifier (100A) can be referred to as, for example, a cascode amplifier, a cascode arrangement, a cascode stack, or a cascode configuration, that includes a common-source input transistor M1 having its source coupled to the reference ground, coupled to (e.g., in series-connection with) cascode transistors (M2, M3, M4).

With continued reference to the prior art stacked FET amplifier (100A), known in the art design techniques configure the gate capacitors (Cg2, Cg3, Cg4) such as to distribute an RF voltage at the drain, D4, of the output transistor, M4, across drain-source nodes of the stacked transistors (M1, M2, M3, M4). In other words, impedance values of the gate capacitors (Cg2, Cg3, Cg4) at a frequency of operation of the amplifier (100A) can be chosen to control RF voltage amplitudes at drain nodes D1, D2 and D3 as a function of the RF voltage at the drain node D4. Accordingly, contrary to some stacked FET amplifier configurations (e.g., low noise amplifiers LNA's) where the gate capacitors are shunted (shorted) at the frequencies of operation, the gate capacitors (Cg2, Cg3, Cg4) shown in FIG. 1A are not shunted at the frequencies of operation and effectively affect operation of the stacked FET amplifier (100A).

Distribution of the RF voltage across the drain-source nodes of the stacked transistors (M1, M2, M3, M4) of the amplifier (100A) shown in FIG. 1A can be determined by impedance values of the gate capacitors (Cg2, Cg3, Cg4) at the frequency of operation so to control impedance seen at a drain node (e.g., D1, D2, D3) of the stacked transistors (e.g., M1, M2, M3), and therefore control an RF voltage at said drain node. As shown in FIG. 1B, an impedance (e.g., $Z_{S2}, Z_{S3}, Z_{S4}$) seen at a drain node (e.g., D1, D2, D3) of each of the transistors (M1, M2, M3) of the prior art stacked FET amplifier (100A) can be made a function of the gate capacitors (e.g., Cg2, Cg3, Cg4) combined with internal elements/parameters of the (cascode) transistors (e.g., M2, M3, M4), such as, for example, gate-to-source capacitances (e.g., Cgs2, Cgs3, Cgs4) and other (not shown). In the exemplary case shown in FIG. 1B, the drain node, D4, of the output transistor M4 sees a load impedance, $R_L$, and the gate capacitors (e.g., Cg2, Cg3, Cg4) are designed to provide real parts of impedances (e.g., $Z_{S2}, Z_{S3}, Z_{S4}$) that, at the frequency of operation, are respectively (substantially) equal to increasing fractions (e.g., $\frac{1}{4}*R_L, \frac{2}{4}*R_L, \frac{3}{4}*R_L$) of the load impedance $R_L$. For example, by making such fractions equal to $\frac{1}{4}*R_L, \frac{2}{4}*R_L$ and $\frac{3}{4}*R_L$ as shown in FIG. 1B, every FET (M1, M2, M3, M4) of the stacked FET amplifier (100A) may (ideally) see a same loadline impedance (e.g., RF voltage across the drain-source node divided by current across the drain-source node). Accordingly, such ideal loadline impedance may be provided by making the real part of impedances looking into the source (e.g., S2, S3, S4) of every cascode FET (e.g., M2, M3, M4) of the stacked FET amplifier (100A) an integer multiple of the load impedance (e.g., $R_L$) seen by the whole stack divided by the stack height (e.g., 4 per FIG. 1B, or any integer number N greater than 2).

With continued reference to FIG. 1B, although the gate capacitors (Cg2, Cg3, Cg4) may be used to effectively control a real part of the source impedances (e.g., $Z_{S2}, Z_{S3}, Z_{S4}$), it may not be effective in controlling an imaginary part of such source impedances. Such imaginary parts may be associated to reactive elements (e.g., capacitances) as part of the internal elements/parameters of the FET transistors (e.g., M2, M3, M4) that may be especially more significant at higher frequencies of operation. Therefore, FETs (e.g., M1, M2, M3) may see loadlines with different and non-zero imaginary parts resulting in RF currents output by each FET having different phases (e.g., different phase shifts). In turn, such RF currents not adding in phase may result in efficiency loss, uneven (or undesired) RF voltage division, additional non-linear distortion and potential reliability issues of the prior art amplifier (100A), all of which may be exacerbated at higher frequencies of operation (e.g., 10 GHz to 100 GHz and higher and especially in millimeter wave frequencies) and limit a maximum frequency of operation of the prior art stacked FET amplifier (100A).

FIGS. 1C and 1D show some prior art configurations aimed at overcoming the deficiencies of the prior art configuration shown in FIGS. 1A and 1B, by introducing (purely) reactive impedances/elements coupled to intermediate sources and/or drain nodes of the stacked amplifier (shown in the figures as having a stack height n, wherein n can be any integer greater than 2). Such reactive impedances are designed to correct phase shifts of currents outputs by the FET transistors and accordingly provide aligned currents that add in phase. For example, as shown in FIG. 1C, a reactive element, $Z_{D1S2}$, may be coupled in series between the drain D1 of the input transistor M1 and the source S2 of the cascode transistor M2 to affect an imaginary part of the impedance, $Z_{D1}$, that the input transistor M1 sees at its drain node, D1, looking into the source of the cascode transistor M2. Alternatively, or in addition, a reactive element, $Z_{S2D2}$, may be coupled in parallel between the source S2 and the drain D2 of the cascode transistor M2 to affect an imaginary part of the impedance $Z_{D1}$. Furthermore, as shown in FIG. 1C, a reactive element, $Z_{D1S2}$, may be coupled between a common source-drain node (D1, S2) that couples the FETs M1 and M2, and the reference ground. Such reactive elements (e.g. $Z_{D1S2}$, $Z_{S2D2}$) shown in FIGS. 1C and 1D may consist of an inductor, a capacitor, or a series-connected inductor and capacitor, and may be adjustable for tuning, for example, at different frequencies of operation.

As described above, the prior art approach shown in FIGS. 1C and 1D for correcting of the phase shifts of the current output by the various stages (FET transistors) of a stacked FET amplifier rely on access to intermediate drain and/or source nodes of the FET transistors. Accordingly, such prior art approach may not be practical in merged stacked FET amplifier configurations where the source and drain regions of adjacent (serially connected) FETs are merged to provide, for example, a reduced form factor configuration that typically does not provide connection (i.e., contacts) to the intermediate drain and/or source nodes.

Teaching according to the present disclosure describe methods and apparatuses for reactance cancellation/control in stacked FET amplifiers, including merged stacked FET amplifiers, that allow to control real and imaginary parts of impedances seen at drains of the FETs.

SUMMARY

According to a first aspect of the present disclosure, an amplifier circuit is presented, the amplifier circuit comprising: a plurality of stacked field-effect (FET) transistors comprising an input transistor and one or more cascode transistors, the one or more cascode transistors comprising an output transistor; and one or more compensation networks, each coupled to a gate of a respective cascode transistor of the one or more cascode transistors; wherein each compensation network comprises: a series-connected resistive-capacitive network coupled between the gate of the respective cascode transistor and a reference ground, the series-connected resistive-capacitive network configured to control a real part and an imaginary part of a source impedance looking into a source of the respective cascode transistor.

According to second aspect of the present disclosure, a method for enhancing a performance of an amplifier is presented, the method comprising: providing a plurality of stacked field-effect (FET) transistors operating for amplification of an RF signal; coupling compensation network comprising at least a series-connected resistive-capacitive network to a gate of each cascode transistor of the plurality of stacked FET transistors; based on the coupling, controlling a value of an imaginary part of a source impedance looking into a source of the each cascode transistor; and based on the controlling, controlling a phase shift of a current output by each transistor of the plurality of stacked FET transistors, thereby enhancing a performance of the amplifier.

According to a third aspect of the present disclosure, a differential amplifier is presented, the differential amplifier comprising: a first amplification path for amplifying a positive component of a differential input signal; and a second amplification path for amplifying a negative component of the differential input signal, wherein each of the first and the second amplification paths comprises an amplifier circuit, comprising: i) a plurality of stacked field-effect (FET) transistors comprising an input transistor for receiving a respective one of the positive or negative component of the differential input signal, and one or more cascode transistors, the one or more cascode transistors comprising an output transistor for outputting a respective one of a positive or negative component of a differential output; and ii) one or more compensation networks, each coupled to a gate of a respective cascode transistor of the one or more cascode transistors; wherein each compensation network comprises: a series-connected resistive-capacitive network coupled between the gate of the respective cascode transistor and a reference node, the series-connected resistive-capacitive network configured to control a real part and an imaginary part of a source impedance looking into a source of the respective cascode transistor.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios, base stations, etc.) having a plurality of devices, such as for example, transistors (e.g., MOSFETs). Persons skilled in the art will appreciate that such electrical circuits comprising transistors can be arranged as amplifiers.

As used herein, the expression "a frequency of operation" or "operating frequency" can refer to a frequency of the RF signal, $RF_{IN}$, input to a device (such as the amplifier 100A).

As used herein, the expression "center frequency" can refer to a reference frequency about which the operating frequency varies. The center frequency may be, for example, associated to a band or channel of operation of an RF communication system, and the operating frequency may be associated to a bandwidth of the band or channel of operation.

Figure 1A:
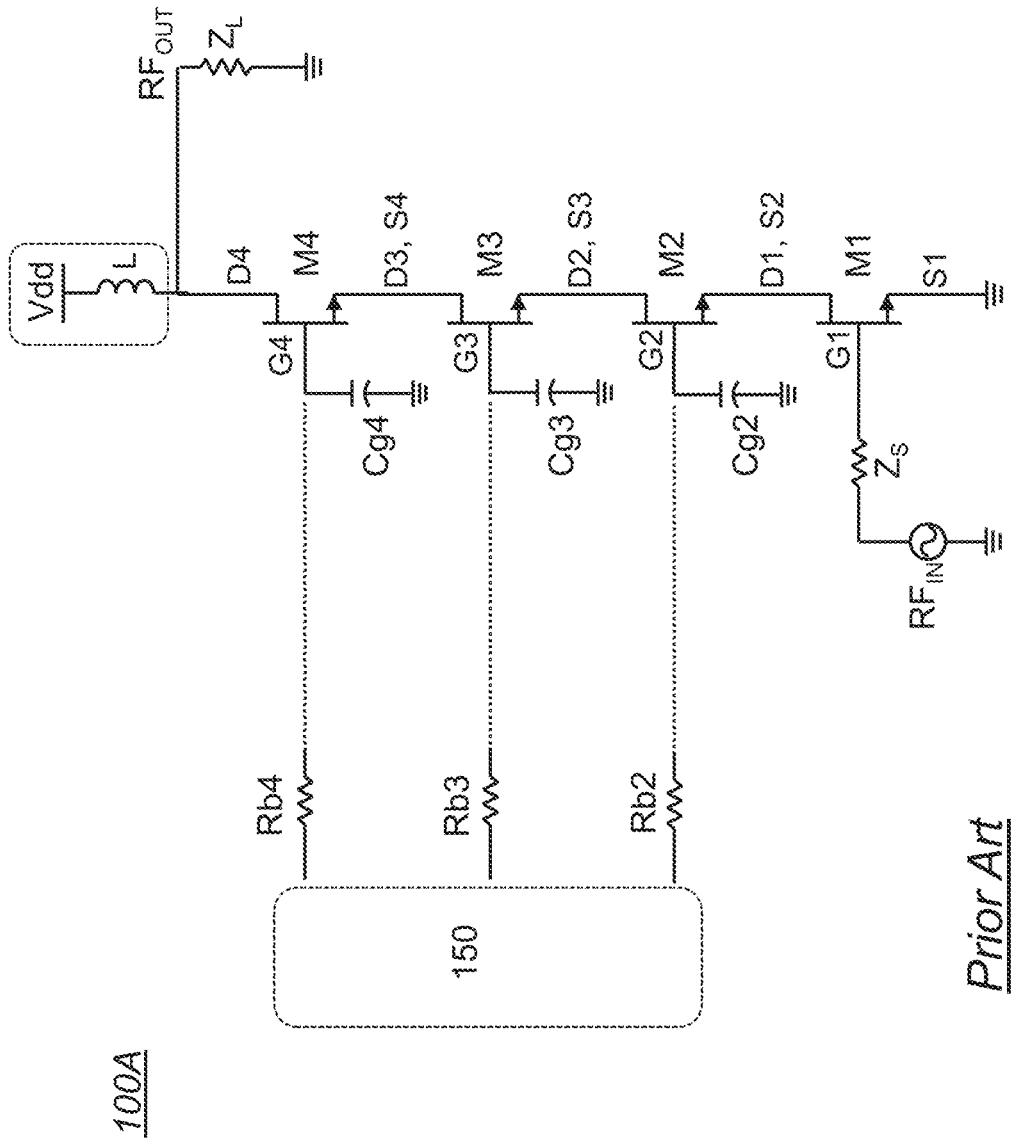
FIG. 1A shows a simplified schematic of a prior art stacked FET amplifier including gate capacitors coupled to gate of cascode FET transistors of the stack.
Figure 1B:
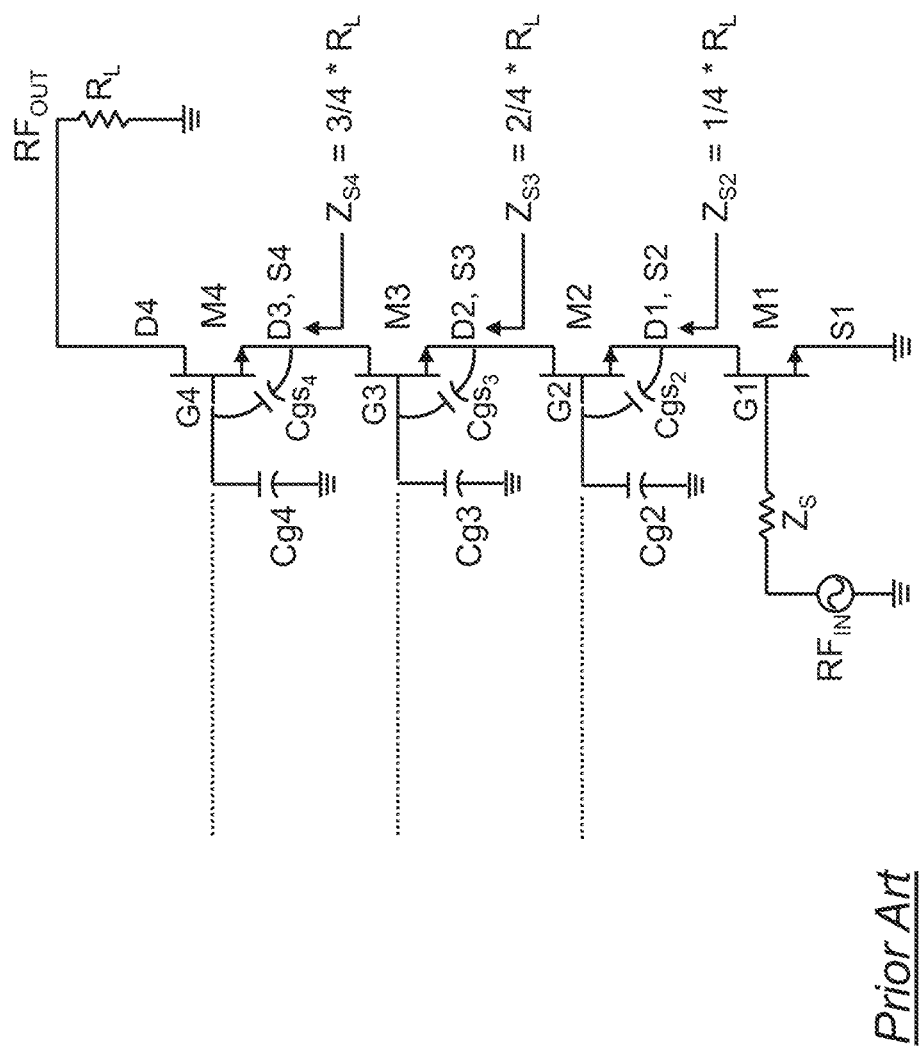
FIG. 1B shows impedances seen at drains of FET transistors of the prior art amplifier of FIG. 1A looking into sources of coupled adjacent FET transistors.
Figure 1D:
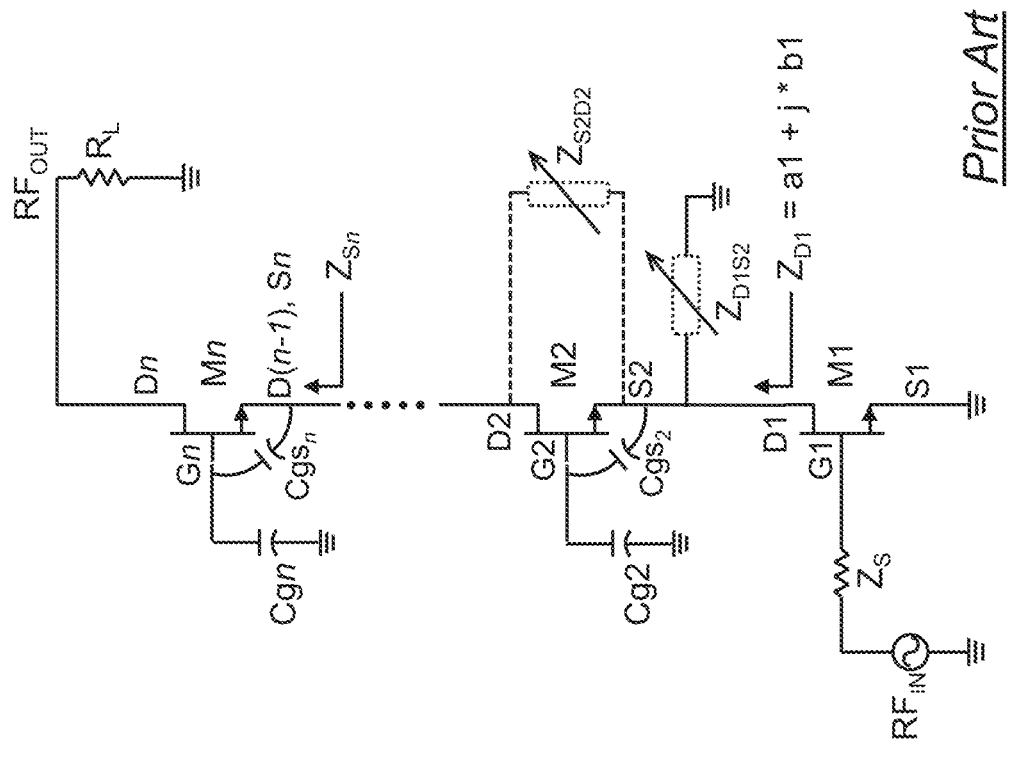
FIG. 1C and FIG. 1D show prior art configurations to control reactance seen at the drains of the FET transistors looking into the sources of coupled adjacent FET transistors.
Figure 1C:
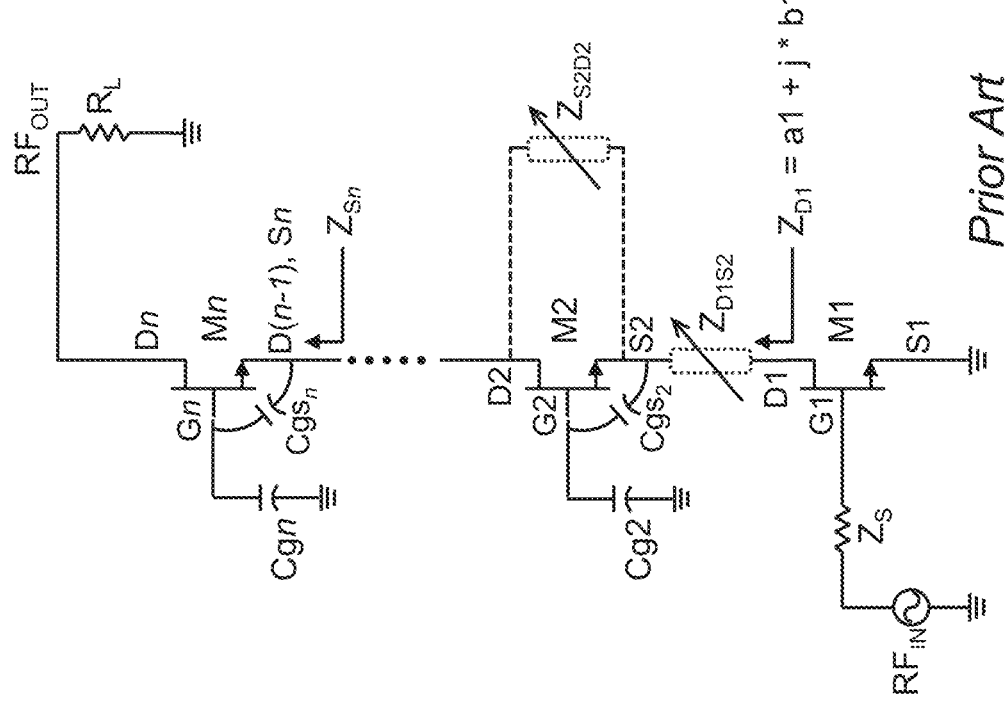
Figure 2A:
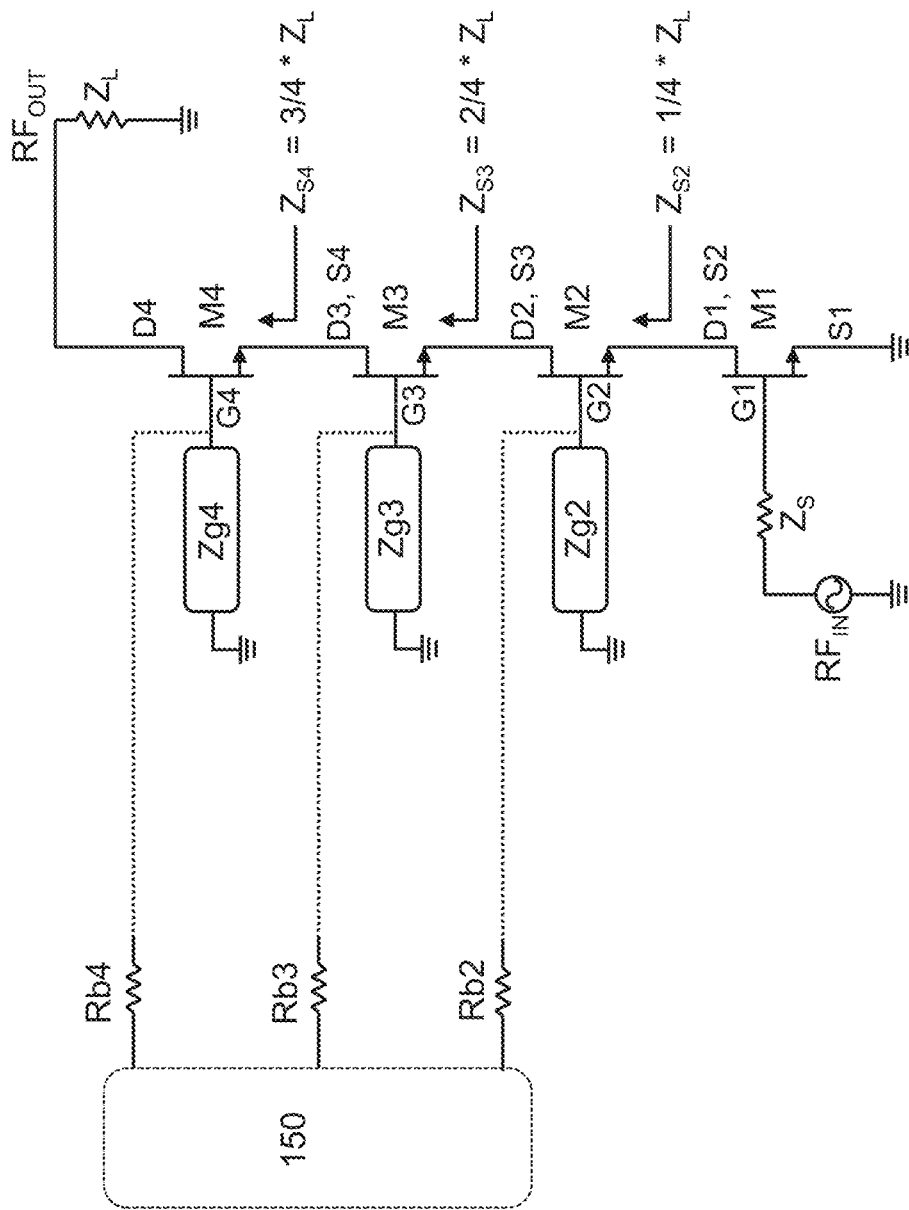
FIG. 2A shows a simplified schematic of a stacked FET amplifier according to an embodiment of the present disclosure, including networks of reactive and resistive elements coupled to gates of cascode transistors of the amplifier that are configured to control reactance seen at drains of the FET transistors looking into sources of coupled adjacent FET transistors.

The present teachings overcome prior art shortcoming of controlling imaginary parts (reactance) of the source impedances (e.g., $Z_{S2}$, $Z_{S3}$, $Z_{S4}$) by coupling a reactance compensation network (e.g., Zg2, Zg3, Zg4) to the respective gates (e.g., G2, G3, G4) of the cascode transistors (e.g., M2, M3, M4) as shown in FIG. 2A. Accordingly, teachings according to the present disclosure may equally apply to stacked FET amplifiers having merged transistors by accessing gate terminals only and without requiring access or insertion of components within the stack, which is specifically advantageous for compact merged stacks. As can be seen in FIG. 2A, the reactance compensation gate-impedance networks (e.g., Zg2, Zg3, Zg4) can be used to control source impedances (e.g., $Z_{S2}$, $Z_{S3}$, $Z_{S4}$) according to a desired distribution of the $RF_{OUT}$ voltage across the transistors (e.g. M1, M2, M3, M4) of the stack. For example, assuming the $RF_{OUT}$ voltage is provided through an output load, $Z_L$, that includes real part (e.g., real($Z_L$)) and imaginary part (e.g., imag($Z_L$)), then an equal, or substantially equal, or substantially uniform, distribution of such RF voltage across the transistors of the stack may be obtained by controlling, via the reactance compensation networks (Zg2, Zg3, Zg4), real part and imaginary part of the respective source impedances ($Z_{S2}$, $Z_{S3}$, $Z_{S4}$), so that $Z_{S2}=\frac{1}{4}*Z_L$, $Z_{S3}=\frac{2}{4}*Z_L$, and $Z_{S4}=\frac{3}{4}*Z_L$, wherein $Z_L$=real($Z_L$)+j*(imag($Z_L$)). It should be noted that teachings according to the present disclosure should not be limited to controlling the respective source impedances for an equal distribution of the (output) RF voltage across the transistors of the stacks, as such teachings may equally apply to any distribution, including unequal distribution whereby, for example, a larger portion of the RF voltage may be provided across, for example, the input transistor (e.g., M1), the output transistor (e.g., M4), or any other cascode transistor (e.g., M2, M3).

Figure 2B:
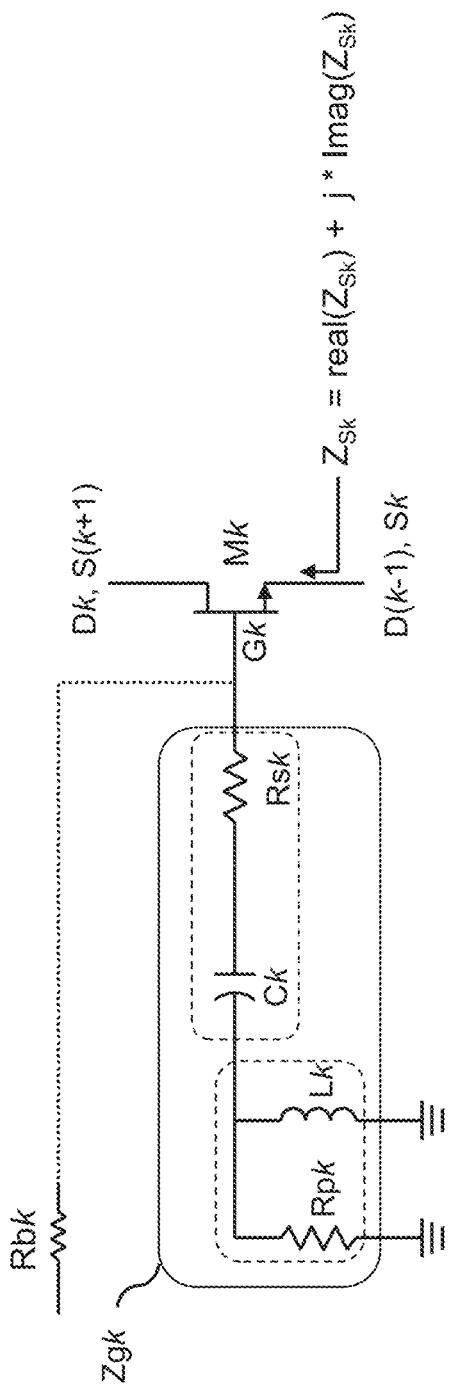
FIG. 2B shows a possible configuration of reactive and resistive elements of a compensation network coupled to a gate of a cascode transistor shown in FIG. 2A.

FIG. 2B shows a configuration according to an exemplary embodiment of the present disclosure of reactive and resistive elements (Rsk, Ck, Rpk, Lk) of a (reactance) compensation network, Zgk, coupled to a gate, Gk, of a cascode transistor, Mk. The transistor Mk can be any of the cascode transistors (M2, M3, M4) shown in the stacked FET amplifier of FIG. 2A, or of an equivalent higher order stacked FET amplifier that includes a number n of stacked FET transistors, wherein n is an integer number equal to, or larger than, two. As shown in FIG. 2B, the compensation network Zgk may include series-connected resistive element Rsk and capacitive element Ck, that are coupled to a parallel-connected resistive element Rpk and inductive element Lk. Such elements may also be described as a first series-connected resistive-capacitive network (Rsk, Ck), and a second parallel-connected resistive-inductive network (Rpk, Lk), wherein the first and the second networks are series-connected between the gate (e.g., Gk) of the FET transistor (e.g., Mk), and the reference ground. It should be noted that in the present disclosure, the novel compensation network may interchangeably be referred to as: "reactance compensation network" since the compensation network is used to affect reactance looking into the source of the transistor; or "compensation gate-impedance network" since the compensation network is coupled to the gate of the transistor to affect gate impedance of the transistor in order to affect the reactance looking into the source of the transistor; or simply "compensation network".

Figure 2C:
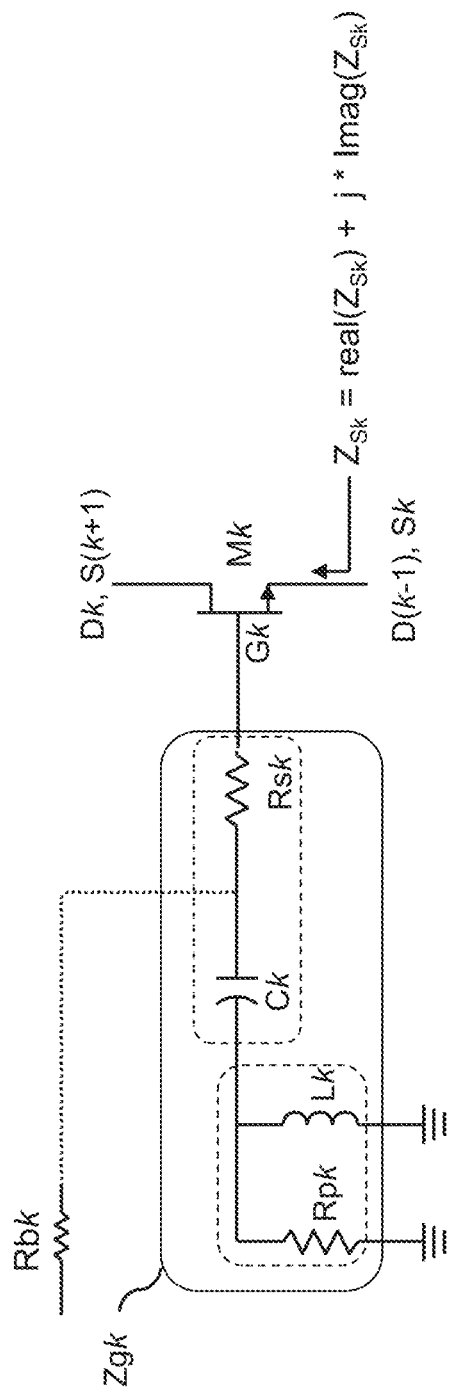
FIG. 2C shows an alternative coupling between a compensation network shown in FIG. 2A and a DC biasing circuit that provides gate biasing voltage.

According to an exemplary embodiment of the present disclosure, as shown in FIG. 2B and FIG. 2C, a coupling to a DC biasing circuit (e.g., 150 of FIG. 2A) via the resistor Rbk can be provided at either sides of the resistive element Rsk of the compensation network Zgk.

Figure 2D:
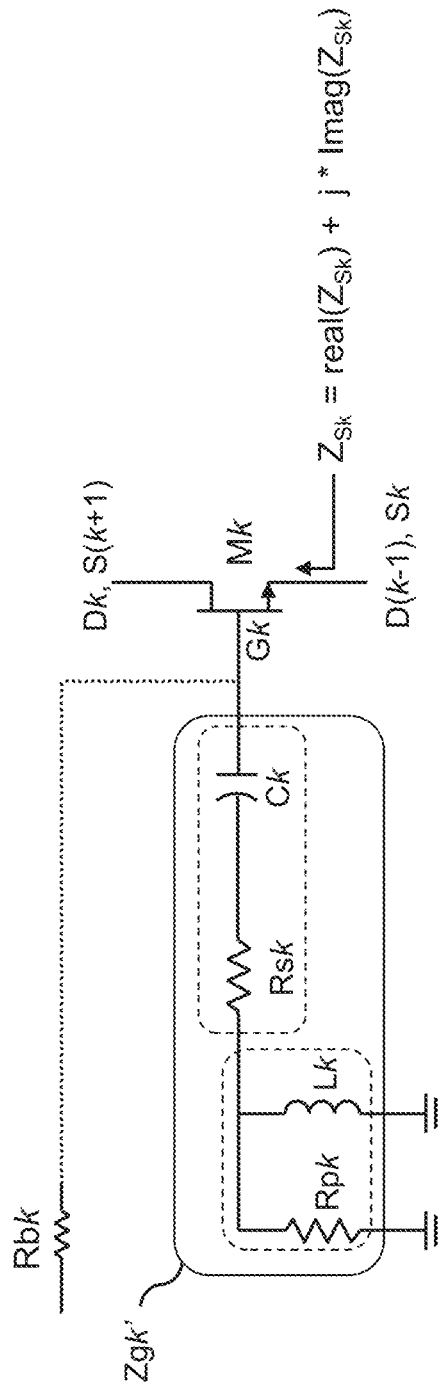
FIG. 2D shows another possible configuration of reactive and resistive elements of a compensation network coupled to a gate of a cascode transistor shown in FIG. 2A.

According to an exemplary embodiment of the present disclosure, an order of connection between elements Rsk and Ck of the first element may be reversed as shown in FIG. 2D. As will be clearly understood to a person skilled in the art, in such configuration, a coupling to the DC biasing circuit (e.g., 150 of FIG. 2A) may only be provided via a connection to the gate (e.g., Gk) of the FET transistor (e.g., Mk).

Figure 6A:
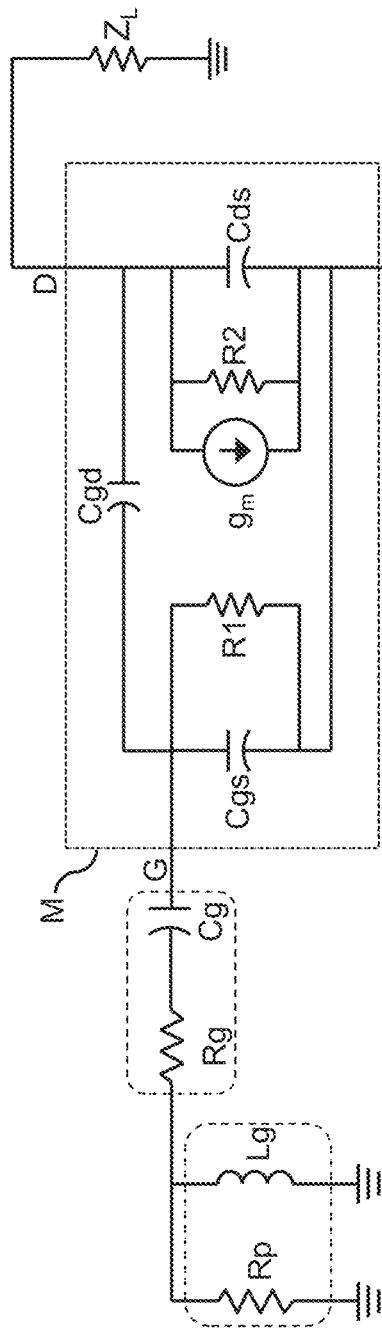
FIG. 6A shows a small signal equivalent circuit of a FET transistor having a gate that is coupled to ground through a resistive and capacitive network that includes a series-connected capacitor and resistor that is coupled to a parallel-connected resistor and inductor according to an embodiment of the present disclosure.

With reference to FIGS. 2B, 2C and 2D, according to various embodiments of the present disclosure, the compensation network Zgk may include only the first series-connected resistive-capacitive network (Rsk, Ck) (e.g., as shown in FIG. 6A later described), or the first series-connected resistive-capacitive network (Rsk, Ck) and the second parallel-connected resistive-inductive network (Rpk, Lk). Configuration of the compensation network Zgk to include only the first network, or the first and the second network, may be based, for example, on a desired performance of a corresponding stacked FET amplifier (e.g., FIG. 2A), including performance with respect to efficiency, RF voltage division, non-linear distortion and higher frequencies of operation. Such performance can be a function of a control capacity with respect to the source impedance of the compensation network Zgk coupled to the gate Gk of the FET transistor Mk. Such control capacity may be, for example, in view of an amount by which the compensation network can affect the imaginary part and/or the real part of the source impedance.

Figure 2E:
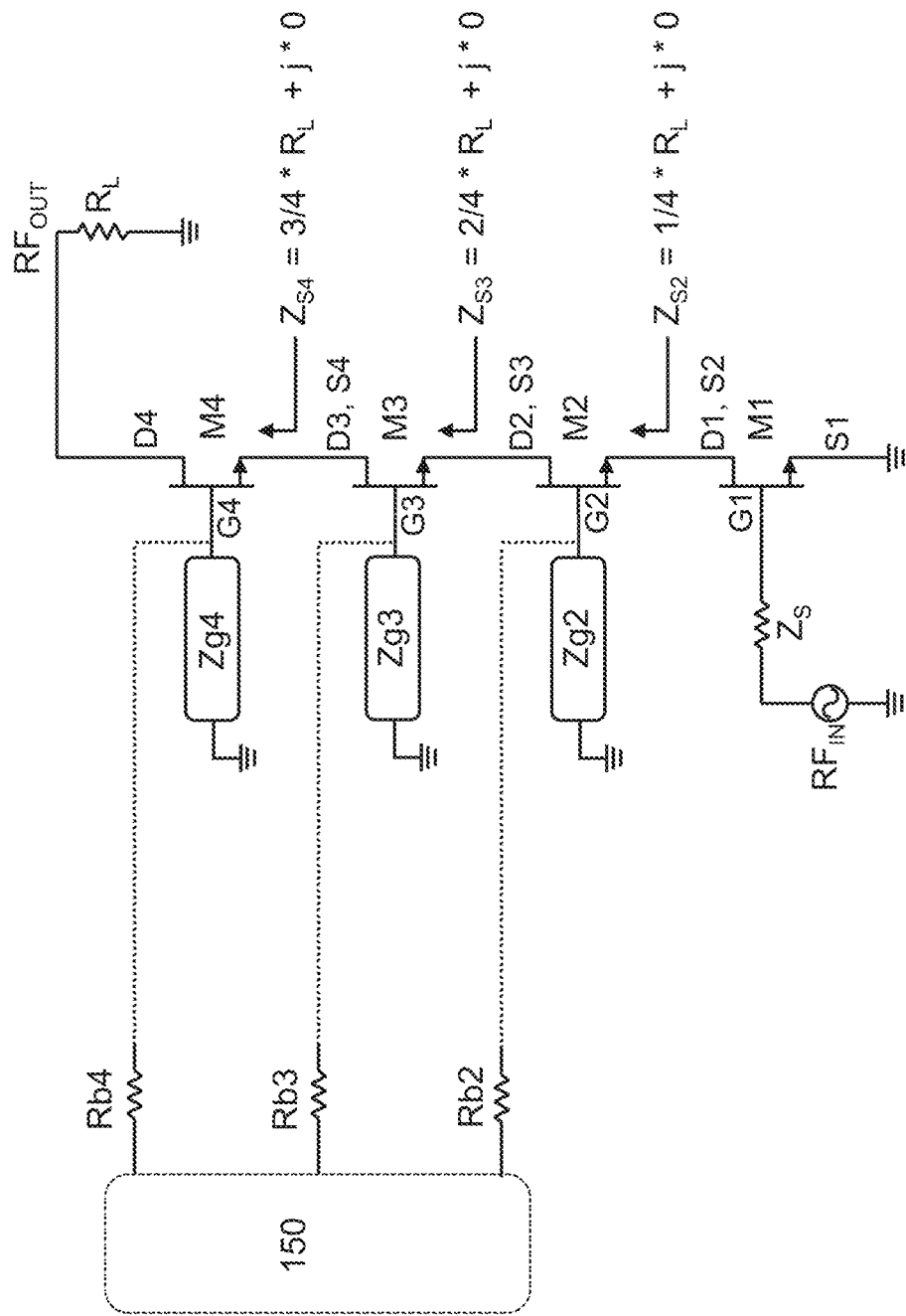
FIG. 2E shows a configuration according to an exemplary embodiment of the present disclosure, wherein the compensation networks according to FIG. 2A are configured to cancel imaginary parts of source impedances seen at drains of transistors of the stacked FET amplifier.

With reference to FIG. 2E, according to an embodiment of the present disclosure the compensation gate-impedance networks (e.g., Zg2, Zg3, Zg4) can be configured to control the source impedances (e.g., $Z_{S2}$, $Z_{S3}$, $Z_{S4}$) to only include real part, and therefore to cancel a corresponding imaginary part. In other words, each of the compensation networks (e.g., Zg2, Zg3, Zg4) can be configured to cancel reactive elements provided by the internal elements/parameters of each of the cascode transistors (e.g., M2, M3, M4) that may affect phase of current output by respective adjacent transistors (e.g., M1, M2, M3). For example, as shown in FIG. 2E, for a resistive output load, $R_L$, the compensation networks (Zg2, Zg3, Zg4) can control the source impedances ($Z_{S2}$, $Z_{S3}$, $Z_{S4}$) to be resistive impedances having respective values equal to $\frac{1}{4}*R_L$, $\frac{2}{4}*R_L$ and $\frac{3}{4}*R_L$, so to provide an equal distribution of the RF voltage at the output load, RL, across the transistors (M1, M2, M3, M4). It should be noted that since the source impedances do not have an imaginary part, they can be essentially invariable with respect to an operating frequency. Accordingly, a performance of the configuration shown in FIG. 2E, including performance with respect to the distribution of the RF voltage, can be maintained over an extended range of operating frequencies, such as, for example, in a range from 10 MHz to 20 GHz and beyond, such as 100 GHz. Accordingly, teachings according to the present disclosure may apply to RF frequencies as well as millimeter wave frequencies. It should be noted that specific (e.g., resistance, frequency, etc.) values described in the present disclosure should not necessarily be considered as exact values, as other values "about" such specific values may equally satisfy the description. As used herein, the term "about" when referenced to a specific (e.g., resistance, frequency, etc.) value may imply any value within a range of +/−10% of the specific value.

As can be clearly taken from the above description, performance of the compensation networks (e.g., Zgk of FIG. 2A-2E) according to the present disclosure can be evaluated with respect to their ability to affect an imaginary part of the source impedance (e.g., $Z_{Sk}$ of FIGS. 2A-2E) looking into a corresponding source of a FET transistor (e.g., Mk of FIGS. 2A-2E). In particular, such performance may be evaluated with respect to capacity to cancel, or substantially reduce, such imaginary part. Description with reference to following FIGS. 3A-7B evaluate such performance by considering a well known in the art small signal equivalent circuit of a FET transistor that can be any of the cascode transistors, Mk, k=2, 3, etc., discussed above.

Figure 3A:
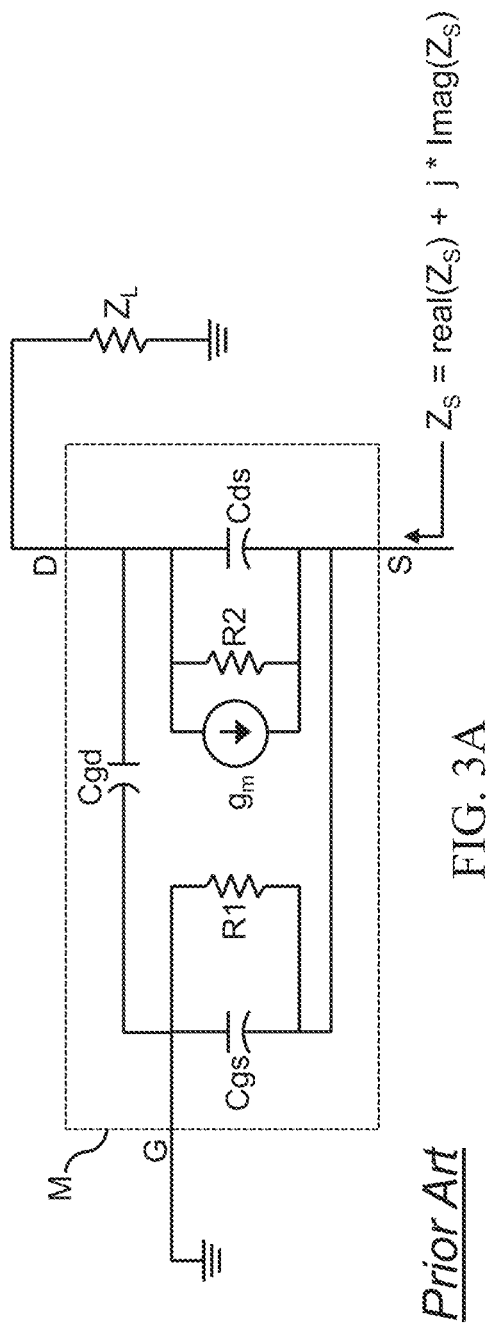
FIG. 3A shows a small signal equivalent circuit of a common gate FET transistor having a gate that is grounded.

FIG. 3A shows the small signal equivalent circuit model of a FET transistor, M, having a gate, G, that is grounded, or in other words, a common gate FET transistor. Included in the model are small signal parameters that include respective gate-to-source, gate-to-drain and drain-to-source capacitances (Cgs, Cgd, Cds), input stage resistor, R1 (also known as Rg, intrinsic gate resistance of a FET transistor), that is in parallel with the gate-to-source capacitance, Cgs, and output (current gain) stage resistor, R2 (also known as Rds=$1/g_{ds}$), that is in parallel with current gain (transconductance, $g_m$) and the drain-to-source capacitance, Cds. As known to a person skilled in the art, a small signal voltage across the input stage resistor, R1, controls an output current that flows through the parallel combination of the drain-to-source capacitance, Cds, and the output stage resistor, R2, the output current having a current gain provided by $g_m$.

Figure 3B:
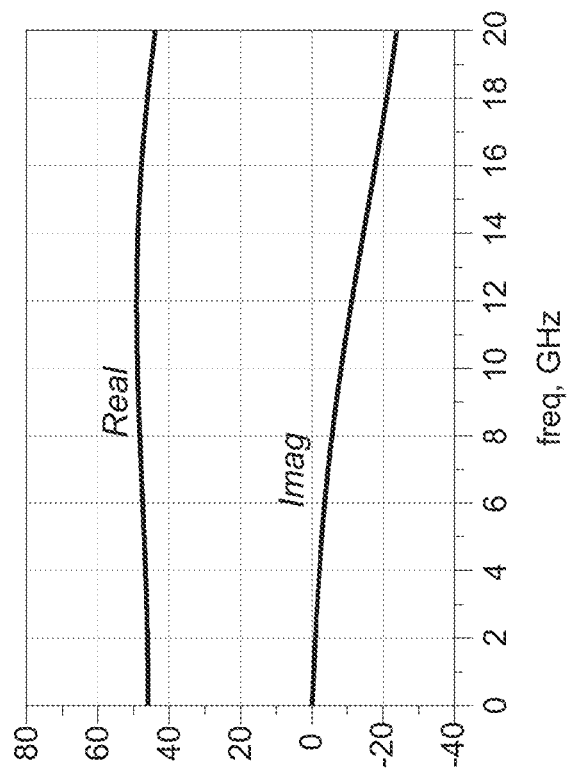
FIG. 3B shows graphs representative of real and imaginary parts of an input source impedance of the configuration shown in FIG. 3A as a function of frequency.

FIG. 3B shows graphs representative of real and imaginary parts of an input source impedance, $Z_S$, of the configuration shown in FIG. 3A as a function of frequency. As can be seen in such graphs, the real part (e.g., resistive component of the impedance $Z_S$), varies within a frequency range of DC to 20 GHz while remaining bounded by a low value of about 40 (e.g., resistance of 40 Ohms) and a high value of about 50 (e.g., resistance of 50 Ohms). On the other hand, the imaginary part of the impedance $Z_S$ varies from a value of zero at DC to about −25 at 20 GHz. The negative value of the imaginary part of $Z_S$ indicating that the reactive component of the impedance $Z_S$ is capacitive. It should be noted that such graphs (as well as graphs in FIGS. 4B, 5B, 6B) are based on exemplary parameters of the transistor model that include ($g_m$, $g_{ds}$, Cgs, Cgd, Cds, $Z_L$)=(26.9 mS, 2.4 mS, 81.8 fF, 40.0 fF, 144 Ohm), with units according to well known in the art standards.

With continued reference to FIG. 3B, as clearly understood by a person skilled in the art, the real part and imaginary part of the impedance $Z_S$ are solely based on the parameters of the transistor and the load impedance, $Z_L$, coupled to the drain, D, of the transistor, M. Accordingly, cascode transistors of a stacked FET amplifier having common gates (per FIG. 3B) may not provide handles to control the impedance $Z_S$, unless via (impractical) change of individual characteristics (internal parameters) of each of the cascode transistors for operation at a given frequency. For example, if the transistor, M, shown in FIG. 3A is cascode transistor M2 of FIG. 2E seeing a load impedance, $Z_L$=144 Ohms, then for an equal RF distribution, the source impedance $Z_S$ of the transistor M should be equal to $\frac{1}{2}*Z_L$=72 Ohms, which cannot be provided by the common gate configuration of FIG. 3A. This is a reason why prior art configurations couple (external) capacitors to gates of the cascode transistors as shown in FIG. 4A.

Figure 4A:
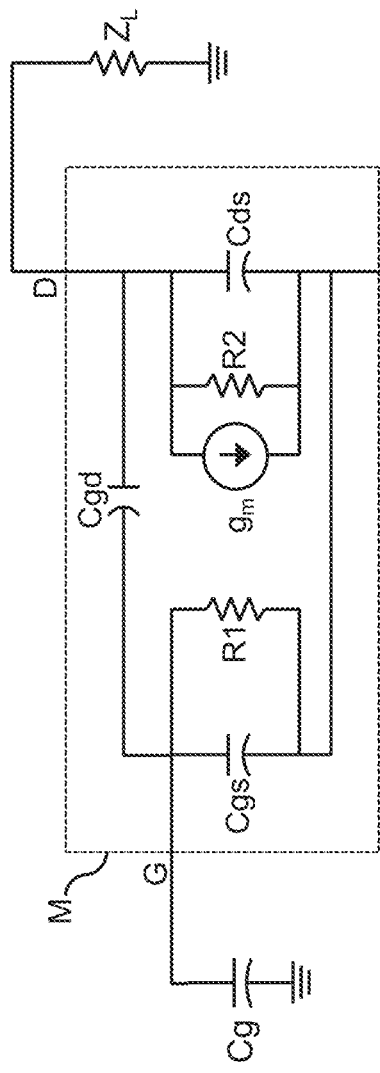
FIG. 4A shows a small signal equivalent circuit of a FET transistor having a gate that is coupled to ground through a capacitor according to a prior art configuration.

FIG. 4A shows a small signal equivalent circuit model of the FET transistor, M, described with reference to FIG. 3A, having the gate, G, that is coupled to ground through a capacitor, Cg. As can be seen in the corresponding graphs of FIG. 4B, a size (capacitance) of such gate capacitor can allow control of the real part (resistive) of the source impedance, $Z_S$, such as to obtain the exemplary value of about 72 Ohm, equal to $\frac{1}{2}*Z_L$. The size of the capacitor, Cg, can be obtained by plugging parameter values of the transistor model, load impedance, $Z_L$, and desired source impedance, $Z_S$, into the following formula:

$$C_g = \frac{(Z_L - Z_S)(C_{gd} + C_{gs})g_{ds} + C_{gd} + C_{gs} + (Z_L - Z_S)g_m C_{gd}}{(Z_S - Z_L)g_{ds} + Z_S g_m - 1}$$

Figure 4B:
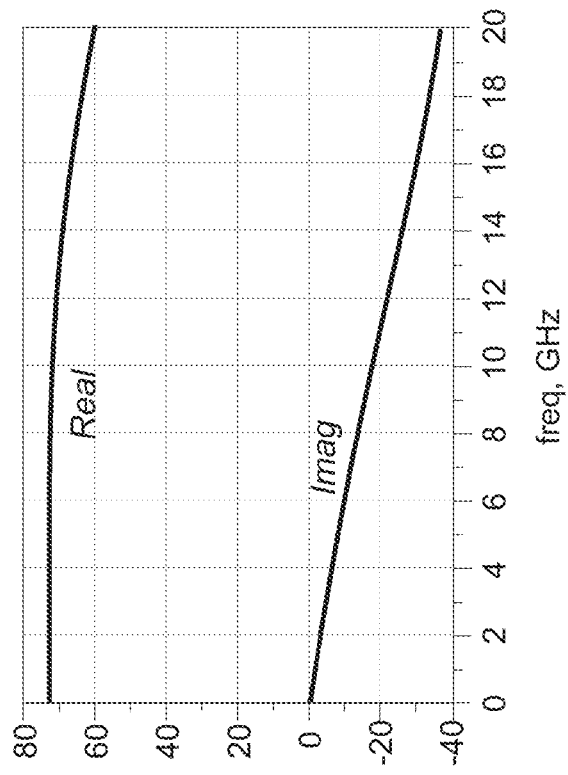
FIG. 4B shows graphs representative of real and imaginary parts of an input source impedance of the configuration shown in FIG. 4A as a function of frequency.

As can be seen in FIG. 4B, addition of the gate capacitor, Cg, may allow control of the real part of the source impedance, ZS, within a limited frequency range, as the value of the real part droops past about 7 GHz. More importantly, as can be clearly seen in the graph of FIG. 4B, the imaginary part of the source impedance, ZS, is negative, according to an approximately linear function of the frequency. In other words, the source impedance, ZS, includes a substantial capacitance which can cause increasing degrees (with respect to increasing frequencies) of phase shifts of current output at the drain of the transistor, M, of FIG. 4A. As described above, this problem of phase shifts can be overcome by the present teachings using (compensation) gate-impedance network configurations coupled to the gate of the cascode transistor as shown below in FIGS. 5A and 6A.

Figure 5A:
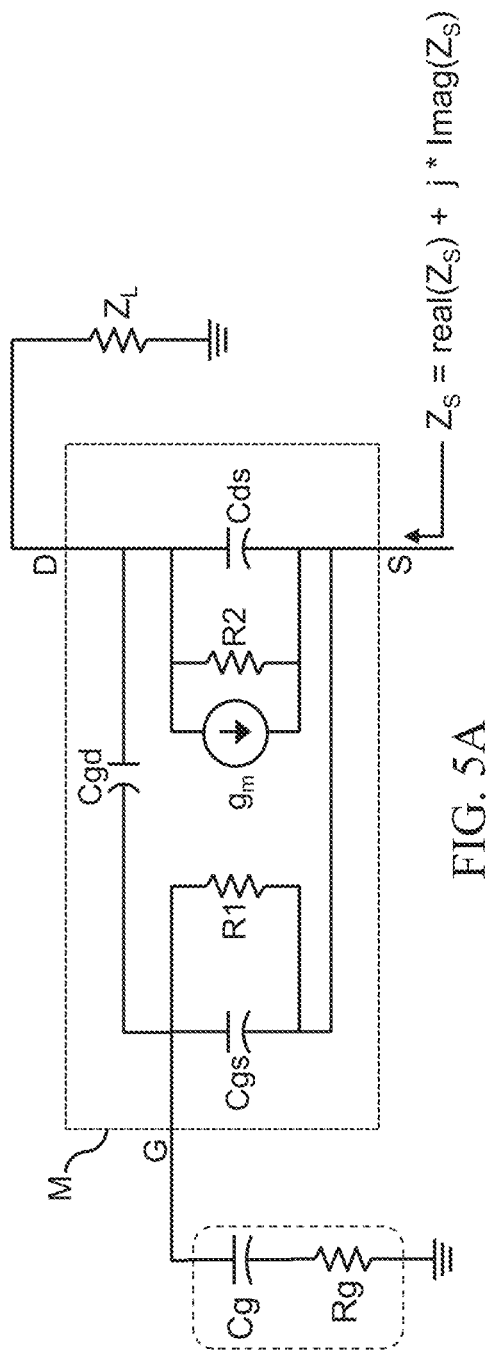
FIG. 5A shows a small signal equivalent circuit of a FET transistor having a gate that is coupled to ground through a series connected capacitor and resistor according to an embodiment of the present disclosure.

FIG. 5A shows the small signal equivalent circuit of the FET transistor, M, of FIG. 3A, having a gate that is coupled to ground through a series-connected capacitor, Cg, and resistor, Rg, according to an embodiment of the present disclosure. As can be seen in the corresponding graphs of FIG. 5B, and similar to the prior art configuration described above with reference to FIGS. 4A and 4B, values of the capacitor, Cg, and the resistor, Rg, of the compensation network (Rg, Cg) coupled to the gate, G, of the transistor, M, can allow control of the real part (resistive) of the source impedance, $Z_S$, such as to obtain the exemplary value of about 72 Ohm, equal to $\frac{1}{2}*Z_L$.

Figure 5B:
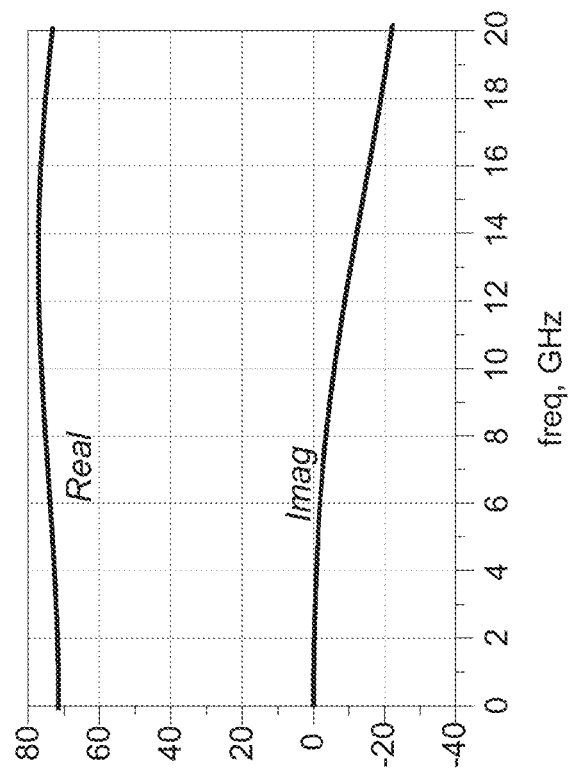
FIG. 5B shows graphs representative of real and imaginary parts of an input source impedance of the configuration shown in FIG. 5A as a function of frequency.

With continued reference to FIGS. 5A and 5B, contrary to the prior art configuration of FIG. 4A/4B, for a given set of values of the compensation network (Rg, Cg), control of the real part of the source impedance, ZS, according to a desired value can be maintained over an extended range of frequencies, such as for example, DC to 20 GHZ. In addition, and in stark contrast to the prior art configuration of FIG. 4A/4B, such compensation network (Rg, Cg) can further control the imaginary part of the source impedance, ZS such as to maintain a substantially reduced capacitance component (imaginary part) in a frequency range from DC to about 6 GHz. In other words, the compensation network (Rg, Cg) can cancel reactance of the source impedance, ZS, over such frequency range. According to an exemplary embodiment of the present disclosure, for the exemplary parameter values of the transistor, M, described above, a value of ZL=144 Ohms, and a desired value of ZS=72 Ohms, the size of the capacitor, Cg, can be made equal to the size obtained by the equation presented above with reference to FIG. 4A/4B. For example, such size of the capacitor, Cg, being calculated to be about 288 fF (i.e., 10-15 F), a resistance value of the resistor, Rg, of about 35 Ohms may substantially cancel/null the reactance of the source impedance, ZS, over the frequency range from DC to about 6 GHz. Other resistance values of the resistor, Rg, may be used for different frequency ranges.

Figure 6B:
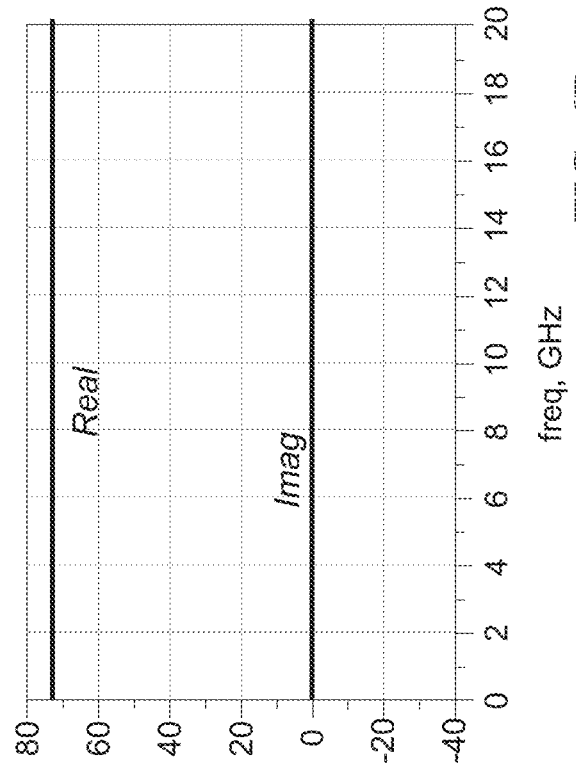
FIG. 6B shows graphs representative of real and imaginary parts of an input source impedance of the configuration shown in FIG. 6A as a function of frequency.

As can be seen in the graphs of FIG. 5B, at higher frequencies of operation (e.g., >6 GHz), increased capacitance (negative imaginary part) can be observed at the source impedance, $Z_S$. Accordingly, for operation at such higher frequencies, the compensation network may include an additional parallel network (Rp, Lg) as shown in FIG. 6A according to another embodiment of the present disclosure. As shown in the graphs of FIG. 6B, for a given set of value of the elements (Rg, Cg, Rp, Lg), such compensation network can allow full cancellation of imaginary part (equal to zero) while maintaining the real part at the exact desired value (e.g., 72) over the entire frequency range (e.g., DC to 20 GHz). It should be noted that response shown in FIG. 6B can extend over a larger frequency range, such as, for example, DC to 100 GHz. In other words, the compensation network according to the present teachings can be used in applications ranging from RF frequencies to millimeter wave frequencies.

Figure 7A:
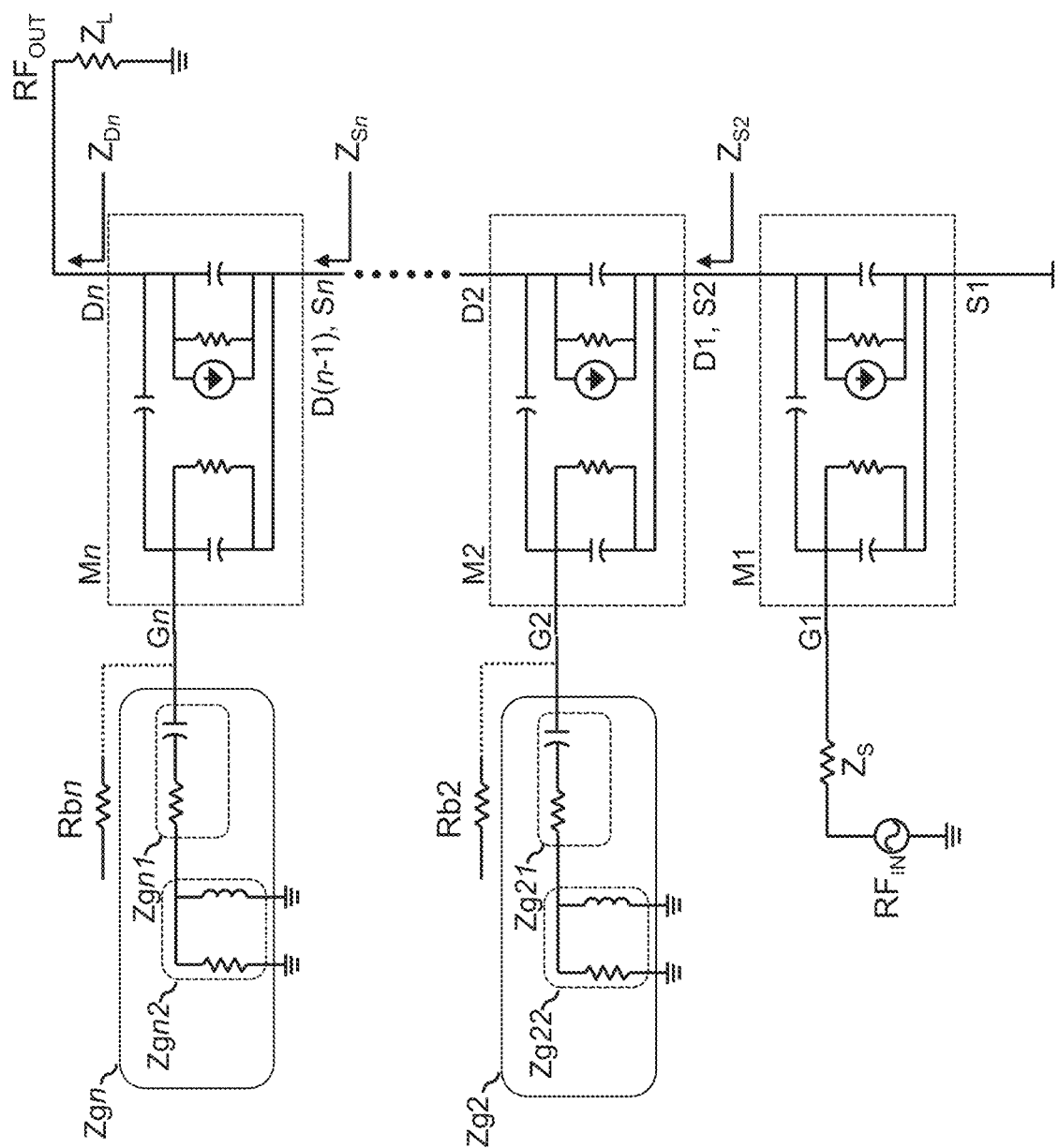
FIG. 7A shows a small signal equivalent circuit of the stacked FET amplifier of FIG. 2A with the network of reactive and resistive elements according to FIG. 6A.
Figure 7B:
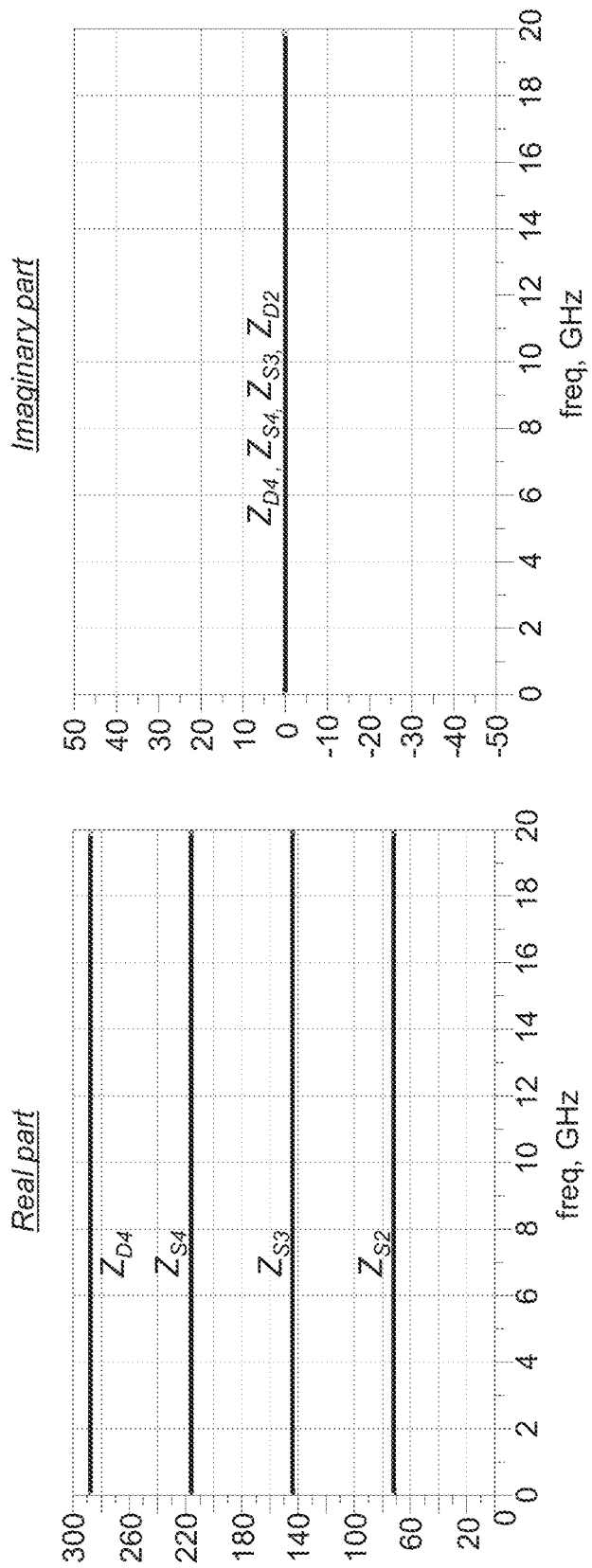
FIG. 7B shows graphs representative of real and imaginary parts of input source impedances of cascode FET transistors of the configuration shown in FIG. 7A as a function of frequency.

FIG. 7A shows a small signal equivalent circuit of the stacked FET amplifier of FIG. 2A wherein each gate of the cascode transistors (M2, . . . , Mn) is coupled to a compensation network (Zg2, . . . , Zgn) of reactive and resistive elements according to FIG. 6A. As described with reference to FIG. 6A, such compensation network can include a first series-connected resistive-capacitive network, (Zg21, . . . , Zgn1), that is coupled to a second parallel-connected resistive-inductive network, (Zg22, . . . , Zgn2). Values of the components (e.g., Rg, Cg, Rp, Lg of FIG. 6A) of such compensation network can be calculated in view of a value of the load, $Z_L$, coupled to the drain, Dn, of the output transistor, Mn, and further in view of, for example, a desired distribution (across the transistors of the stacked FET amplifier) of the RF voltage provided at the output of the stacked FET amplifier into the load, $Z_L$. For example, for an equal distribution as described above with reference to FIG. 2A, and a resistive load, $Z_L=R_L$, desired values of the source impedances ($Z_{S2}$, . . . , $Z_{Sk}$, . . . , $Z_{Sn}$) are established (e.g., ZSk=k/n*$R_L$, k=2, . . . , n−1), and therefore, load impedances at corresponding drains, Dk, are also established (e.g., $Z_{Dk}=Z_{S(k+1)}=(k+1)/n*R_L$), which in combination allow calculation of the values of the components of each compensation network, Zgk. For an exemplary case where stack height is four (i.e., n=4), the resistive load impedance $R_L$=288 Ohms, and an equal distribution is desired, then each of the compensation networks, Zgk, can be configured to provide ($Z_{S2}$, $Z_{S3}$, $Z_{S3}$, $Z_{S4}$)=(¼*288+j*0, ²⁄₄*288+j*0, ¾*288+j*0, 288) as shown in the graphs of FIG. 7B. As noted above, in applications with frequencies of operation that are lower, such as, for example, in a range from DC to about 6 GHz, each compensation network, Zgk, can include only the first series-connected resistive-capacitive network, Zgnk (e.g., Zg21, . . . , Zgn1 of FIG. 7A). In other words, the complexity of the compensation gate-impedance network may vary with respect to a range of frequency of operation.

Figure 8:
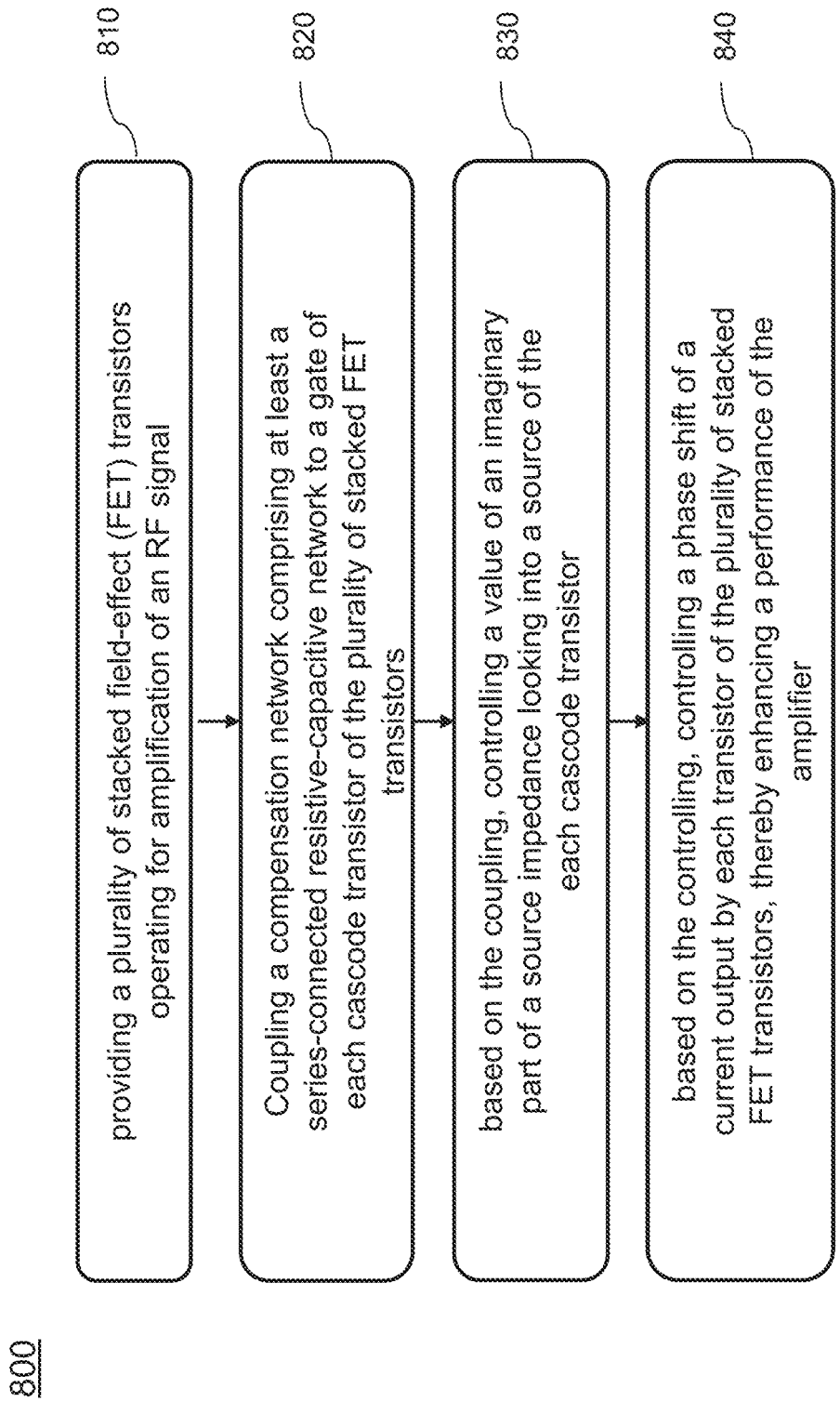
FIG. 8 is a process chart showing various steps of a method for enhancing a performance of an amplifier.

FIG. 8 is a process chart (800) showing various steps of a method for enhancing a performance of an amplifier. As can be seen in FIG. 8, such steps comprise: providing a plurality of stacked field-effect (FET) transistors operating for amplification of an RF signal, per step (810); coupling a compensation network comprising at least a series-connected resistive-capacitive network to a gate of each cascode transistor of the plurality of stacked FET transistors, per step (820); based on the coupling, controlling a value of an imaginary part of a source impedance looking into a source of the each cascode transistor, per step (830); and based on the controlling, controlling a phase shift of a current output by each transistor of the plurality of stacked FET transistors, thereby enhancing a performance of the amplifier, per step (840).

It should be noted that the various embodiments of the stacked FET amplifiers with coupled compensation networks for reactance control or cancellation according to the present disclosure, may be implemented as a monolithically integrated circuit (IC) according to any fabrication technology and process known to a person skilled in the art. In addition, it should be noted that in a non-ideal case where the load impedance $R_L$ may not be purely resistive but may have an imaginary part, the reactance control according to the present disclosure may be implemented to control a distribution of reactance of source impedances across the stack rather than completely cancelling them.

Figure 9A:
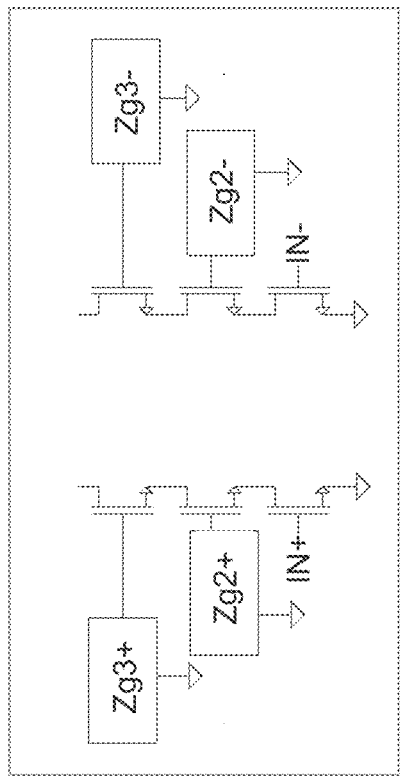
FIG. 9A shows a simplified schematic of a prior art stacked differential amplifier for amplification of positive and negative components of an input differential signal via respective amplification paths.
Figure 9B:
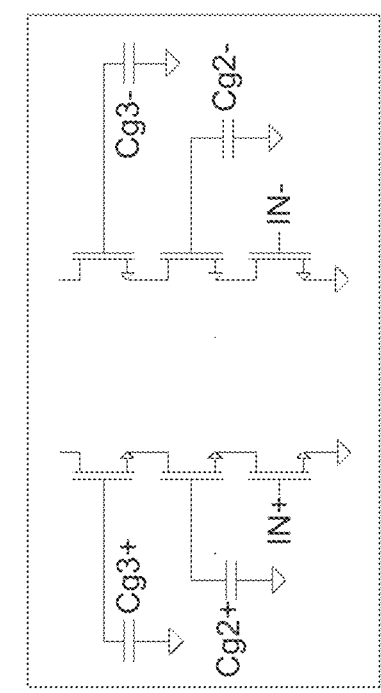
FIGS. 9B, 9C, 9D and 9E show simplified schematics of stacked differential amplifiers according to the present disclosure, wherein each of the amplification paths includes networks of reactive and resistive elements coupled to gates of respective cascode transistors.
Figure 9E:
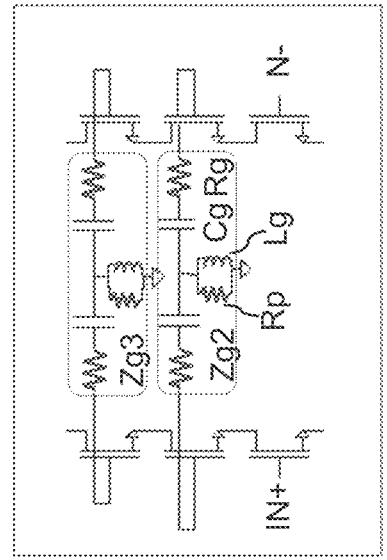
Figure 9D:
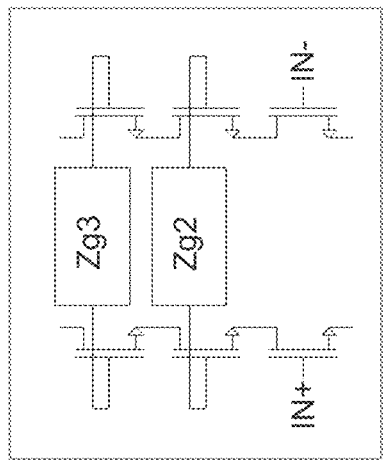
Figure 9C:
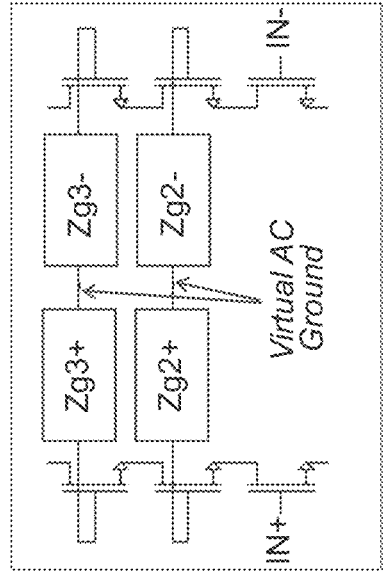

As should be readily apparent to one of ordinary skill in the art, various embodiments of the proposed compensation gate impedance networks can be implemented in stacked differential amplifiers to prevent efficiency loss, uneven (or undesired) RF voltage division, additional non-linear distortion and potential reliability issues of the prior art stacked differential amplifier (FIG. 9A), all of which may be exacerbated at higher frequencies of operation (e.g., 10 GHz to 100 GHz and higher and including millimeter wave frequencies) and limit a maximum frequency of operation of the prior art stacked differential FET amplifier. Exemplary topologies including embodiments of the proposed gate impedance networks are depicted in FIGS. 9B, 9C, 9D, and 9E, all of which include two transistor stacks for respective input of positive (IN+) and negative (IN−) components of a differential input signal, each transistor stack including gate impedance networks according to the present teachings described above. In FIG. 9B, each of the two transistor stacks include gate-impedance networks (e.g., Zg2+ to Zg2−, Zg3+ to Zg3−) that can be according to any one of the above described (single-ended) configurations. In FIG. 9C, the connections between the gate-impedance networks (e.g., Zg2+ to Zg2−, Zg3+ to Zg3−) at each one of the levels of the stack are kept at a virtual AC ground. It should be noted that the concept of virtual ground, especially as related to a differential amplifier, is well known in the art. FIG. 9D shows a similar topology to that of FIG. 9C, where the two gate impedance networks at each of the levels are combined into a single gate-impedance network (e.g., Zg2, Zg3). FIG. 9E shows an exemplary embodiment according to the present disclosure of the single gate-impedance networks of FIG. 9D, wherein each of the single gate-impedance networks Zg2 and Zg3 are based on the configuration shown in FIG. 6A, with a series-connected network (Rg, Cg) coupled to respective gates of each of the levels, and a single shared parallel network (Rp, Lg) centrally coupled to the series-connected networks.

It should be noted that the solutions disclosed herein for controlling a phase shift inside merged stack FET amplifier configurations especially meet the requirements of applications that require higher power amplifier (PA) output power. Larger stack heights, i.e., a larger number of FETs in a stack, may be needed to provide higher power output while dividing the output voltage among the levels of the stack in order to prevent breakdown of individual FETs at each level. On the other hand, the phase shifting problem is exacerbated with an increase in the stack height thereby requiring the control of phase shifts in the stack by controlling impedances according to the methods and circuits described herein. The solutions disclosed herein can provide high power output, high-power handling and reliability at high frequencies, e.g., in millimeter wave frequencies, while preventing loss of amplifier power efficiency due to uncontrolled phase shifts. An even division of output voltage across a stack may maximize reliability by keeping gate-to-source, drain-to-source, and gate-to-drain AC voltage swings within the reliability limits of individual transistors. Especially in millimeter wave frequencies and in phased array implementations, higher per PA output power may enable broader beams which in turn may result in increased robustness in highly mobile use cases and may lower cost by enabling smaller arrays for a given effective isotropic power radiation.

As described herein, an embodiment of the present invention may relate to one or more of the example embodiments, which are enumerated below. Accordingly, the invention may be embodied in any of the forms described herein, including, but not limited to the following Enumerated Example Embodiments (EEEs) which described structure, features, and functionality of some portions of the present invention:

EEE1. An amplifier circuit, comprising: a plurality of stacked field-effect (FET) transistors (M1, . . . , Mk) comprising an input transistor (M1) and one or more cascode transistors (M2, . . . , Mk), the one or more cascode transistors comprising an output transistor (Mk); and one or more compensation networks (Zg2, . . . , Zgk), each coupled to a gate (G2, . . . , Gk) of a respective cascode transistor of the one or more cascode transistors; wherein each compensation network comprises: a series-connected resistive-capacitive network (Rsk, Ck) coupled between the gate of the respective cascode transistor and a reference ground, the series-connected resistive-capacitive network configured to control a real part and an imaginary part of a source impedance ($Z_{Sk}$) looking into a source of the respective cascode transistor.

EEE2. The amplifier circuit as recited in enumerated example embodiment 1, wherein a capacitance of a capacitive element (Ck) of the series-connected resistive-capacitive network is sized to provide a desired distribution of an RF voltage output at a drain of the output transistor across the plurality of stacked FET transistors at DC.

EEE3. The amplifier circuit as recited in enumerated example embodiment 2, wherein the series-connected resistive-capacitive network is configured to provide a value of the real part (real($Z_{Sk}$)) of the source impedance ($Z_{Sk}$) to substantially maintain said distribution over a frequency range from DC to about 20 GHz.

EEE4. The amplifier circuit as recited in enumerated example embodiment 3, wherein said distribution over said frequency range is a substantially uniform distribution.

EEE5. The amplifier circuit as recited in enumerated example embodiment 4, wherein: the RF voltage output at the drain of the output transistor is provided through a resistive load, $R_L$, coupled to a drain of the output transistor, and the series-connected resistive-capacitive network controls the real part of the source impedance to have a value that over said frequency range is substantially equal to k/N*$R_L$, wherein: N is a number of the plurality of stacked FET transistors, k is an order of the respective cascode transistor in a sequence within the stacked FET transistors, k=1 if the respective cascode transistor is adjacent the input transistor, and k=N−1 if the respective cascode transistor is the output transistor.

EEE6. The amplifier circuit as recited in any one of the enumerated example embodiments 1-5, wherein the series-connected resistive-capacitive network is configured to reduce a value of the imaginary part (Imag ($Z_{Sk}$)) of the source impedance ($Z_{Sk}$) over a frequency range from DC to about 6 GHz.

EEE7. The amplifier circuit as recited in enumerated example embodiment 6, wherein the value of the imaginary part over said frequency range is substantially zero.

EEE8. The amplifier as recited in enumerated example embodiment 1, wherein said compensation network further comprises a parallel-connected resistive-inductive network (Rpk, Lk) coupled between the reference ground and the series-connected resistive-capacitive network (Rsk, Ck).

EEE9. The amplifier as recited in enumerated example embodiment 8, wherein a capacitance of a capacitive element of the series-connected resistive-capacitive network is sized to provide a desired distribution of an RF voltage output at a drain of the output transistor across the plurality of stacked FET transistors at DC.

EEE10. The amplifier circuit as recited in enumerated example embodiment 9, wherein the compensation network is configured to provide a value of the real part of the source impedance to exactly maintain said distribution over a frequency range from DC to about 20 GHz and higher.

EEE11. The amplifier circuit as recited in enumerated example embodiment 10, wherein said distribution over said frequency range is a substantially uniform distribution.

EEE12. The amplifier circuit as recited in enumerated example embodiment 11, wherein: the RF voltage output at the drain of the output transistor is provided through a resistive load, $R_L$, coupled to a drain of the output transistor, and the compensation network controls the real part of the source impedance to have a value that over said frequency range is equal to $k/N*R_L$, wherein: N is a number of the plurality of stacked FET transistors, k is an order of the respective cascode transistor in a sequence within the stacked FET transistors, k=1 if the respective cascode transistor is adjacent the input transistor, and k=N−1 if the respective cascode transistor is the output transistor.

EEE13. The amplifier circuit as recited in enumerated example embodiment 8, wherein the compensation network is configured to reduce a value of the imaginary part of the source impedance over a frequency range from DC to about 20 GHz and higher.

EEE14. The amplifier circuit as recited in enumerated example embodiment 13, wherein the value of the imaginary part over said frequency range is substantially zero.

EEE15. The amplifier circuit as recited in any one of the enumerated example embodiments 1-14, wherein the plurality of stacked FET transistors are merged transistors, such that drain and source regions of adjacent transistors of the plurality of the stacked FET transistors are merged.

EEE16. A communication system for communication over a plurality of frequency bands, the communication system comprising the amplifier circuit as recited in any one of the enumerated example embodiments 1-14.

EEE17. The communication system as recited in enumerated example embodiment 16, wherein the plurality of frequency bands span over a frequency range from about 1 GHz to about 20 GHz.

EEE18. The communication system as recited in enumerated example embodiment 16, wherein the plurality of frequency bands span over a frequency range from about 1 GHz to about 100 GHz.

EEE19. A differential amplifier, comprising: a first amplification path for amplifying a positive component (IN+) of a differential input signal (IN+, IN−)); and a second amplification path for amplifying a negative component (IN−) of the differential input signal (IN+, IN−), wherein each of the first and the second amplification paths comprises an amplifier circuit as recited in any one of the enumerated example embodiments 1-14.

EEE20. A monolithically integrated circuit comprising: an amplifier circuit as recited in any one of the enumerated example embodiments 1-15, the amplifier circuit monolithically integrated on a single chip.

EEE21. The monolithically integrated circuit as recited in enumerated example embodiment 20, wherein the circuit is monolithically integrated by using a fabrication technology comprising one of: a) silicon-on-insulator (SOI) technology, and b) silicon-on-sapphire technology (SOS).

EEE22. An electronic module comprising the monolithically integrated circuit as recited in enumerated example embodiment 21.

EEE23. A method for enhancing a performance of an amplifier, the method comprising: providing a plurality of stacked field-effect (FET) transistors operating for amplification of an RF signal; coupling compensation network comprising at least a series-connected resistive-capacitive network to a gate of each cascode transistor of the plurality of stacked FET transistors; based on the coupling, controlling a value of an imaginary part of a source impedance looking into a source of the each cascode transistor; and based on the controlling, controlling a phase shift of a current output by each transistor of the plurality of stacked FET transistors, thereby enhancing a performance of the amplifier.

EEE24. A differential amplifier, comprising: a first amplification path for amplifying a positive component (IN+) of a differential input signal (IN+, IN−); and a second amplification path for amplifying a negative component (IN−) of the differential input signal (IN+, IN−), wherein each of the first and the second amplification paths comprises an amplifier circuit, comprising: i) a plurality of stacked field-effect (FET) transistors comprising an input transistor for receiving a respective one of the positive or negative component of the differential input signal, and one or more cascode transistors, the one or more cascode transistors comprising an output transistor for outputting a respective one of a positive or negative component of a differential output; and ii) one or more compensation networks (Zg2+, Zg3+, Zg2−, Zg3−), each coupled to a gate of a respective cascode transistor of the one or more cascode transistors; wherein each compensation network comprises: a series-connected resistive-capacitive network (Rsk, Ck) coupled between the gate of the respective cascode transistor and a reference node, the series-connected resistive-capacitive network configured to control a real part and an imaginary part of a source impedance ($Z_{Sk}$) looking into a source of the respective cascode transistor.

EEE25. The differential amplifier as recited in enumerated example embodiment 24, wherein said compensation network further comprises a parallel-connected resistive-inductive network (Rpk, Lk) coupled between the reference node and the series-connected resistive-capacitive network.

EEE26. The differential amplifier as recited in enumerated example embodiment 25, wherein said reference node is at a voltage of the reference ground.

EEE27. The differential amplifier as recited in any one of the enumerated example embodiments 25-26, wherein the parallel-connected resistive-inductive network (Rp, Lg of FIG. 9E) is shared between respective compensation networks of the first and the second amplification paths.

EEE28. The differential amplifier as recited in enumerated example embodiment 25, wherein said reference node is a virtual AC ground (FIG. 9C) realized at a common connection between respective compensation networks of the first and the second amplification paths.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.), wireless sensor modules, internet of things (IoT) devices and others. Some embodiments may include a number of methods.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", U.S. Pat. No. 7,123,898, issued on Oct. 17, 2006, entitled "Switch Circuit and Method of Switching Radio Frequency Signals", U.S. Pat. No. 7,890,891, issued on Feb. 15, 2011, entitled "Method and Apparatus Improving Gate Oxide Reliability by Controlling Accumulated Charge", and U.S. Pat. No. 8,742,502, issued on Jun. 3, 2014, entitled "Method and Apparatus for use in Improving Linearity of MOSFETs Using an Accumulated Charge Sink—Harmonic Wrinkle Reduction", the disclosures of which are incorporated herein by reference in their entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, "stacking", such as serially stacking, components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. An amplifier circuit, comprising:
 a plurality of stacked field-effect (FET) transistors (M1, . . . , Mn) comprising an input transistor (M1) and one or more cascode transistors (M2, . . . , Mn), the one or more cascode transistors comprising an output transistor (Mn); and
 one or more compensation networks (Zg2, . . . , Zgn), each connected between a gate (G2, . . . , Gn) of a respective cascode transistor of the one or more cascode transistors and a reference ground;

wherein each compensation network comprises:

a series-connected resistive-capacitive network (Zgn1) comprising a first resistor (Rsk) in series connection with a capacitor (Ck); and a parallel-connected resistive-inductive network (Zgn2) comprising a second resistor (Rpk) connected in parallel with an inductor (Lk), wherein a first terminal of the series-connected resistive-capacitive network (Zgn1) is connected to the gate of the respective cascode transistor, a second terminal of the series-connected resistive-capacitive network (Zgn1) is connected to a first terminal of the parallel-connected resistive-inductive network (Zgn2), and a second terminal of the parallel-connected resistive-inductive network (Zgn2) is connected to the reference ground.

2. The amplifier circuit according to claim 1, wherein:

a first terminal of the capacitor is connected to the gate of the respective cascode transistor, a second terminal of the capacitor is connected to a first terminal of the first resistor, a second terminal of the first resistor is connected to a first terminal of the inductor and a first terminal of the second resistor, and a second terminal of the inductor and a second terminal of the second resistor are connected to the reference ground.

3. The amplifier circuit according to claim 1, wherein:

a first terminal of the first resistor is connected to the gate of the respective cascode transistor, a second terminal of the first resistor is connected to a first terminal of the capacitor, a second terminal of the capacitor is connected to a first terminal of the inductor and a first terminal of the second resistor, and a second terminal of the inductor and a second terminal of the second resistor are connected to the reference ground.

4. The amplifier circuit according to claim 1, wherein:

a first terminal of the inductor and a first terminal of the second resistor are connected to the second terminal of the series-connected resistive-capacitive network, and a second terminal of the inductor and a second terminal of the second resistor are connected to the reference ground.

5. The amplifier circuit according to claim 1, further comprising:

a third resistor (Rbk) connected to each compensation network, each third resistor having a first terminal connected to the first terminal of the series-connected resistive-capacitive network (Zgn1) and the gate of the respective cascode transistor, and each third resistor having a second terminal connected to a DC biasing circuit.

6. The amplifier circuit according to claim 1, wherein:

respective sizes of the capacitor, inductor, first resistor and second resistor are selected to provide, in combination with internal elements/parameters of the respective cascode transistor, a predetermined value of a source impedance ($Z_{Sk}$) looking into the source of the respective cascode transistor.

7. The amplifier circuit according to claim 6, wherein:

the predetermined value of the source impedance includes a real part and an imaginary part that are respectively based on:

a real part and an imaginary part of a load $Z_L$ coupled to a drain of the output transistor, and an order of the respective cascode transistor in a sequence within the stacked FET transistors.

8. The amplifier circuit according to claim 6, wherein:

the predetermined value of the source impedance is configured to provide an RF voltage at the source of the respective cascode transistor that is based on a desired distribution of an RF voltage output at a drain of the output transistor across the plurality of stacked FET transistors.

9. The amplifier circuit according to claim 6, wherein the predetermined value of the source impedance is configured to maintain said distribution over a frequency range from DC to about 20 GHz and higher.

10. The amplifier circuit according to claim 9, wherein said distribution over said frequency range is a substantially uniform distribution.

11. The amplifier circuit according to claim 10, wherein:

the load $Z_L$, is a resistive load, $R_L$, and the predetermined value of source impedance comprises a real part that over said frequency range has a value that is equal to $k/n*R_L$, wherein:

n is a number of the plurality of stacked FET transistors, k is an order of the respective cascode transistor in a sequence within the stacked FET transistors, k=1 if the respective cascode transistor is adjacent the input transistor, and k=n-1 if the respective cascode transistor is the output transistor.

12. The amplifier circuit according to claim 6, wherein the respective sizes of the capacitor, inductor, first resistor and second resistor are selected to reduce a value of the imaginary part of the source impedance over a frequency range from DC to about 20 GHz and higher.

13. The amplifier circuit according to claim 12, wherein the value of the imaginary part over said frequency range is substantially zero.

14. The amplifier circuit according to claim 1, wherein the plurality of stacked FET transistors are merged transistors, such that drain and source regions of adjacent transistors of the plurality of the stacked FET transistors are merged.

15. The amplifier circuit according to claim 1, wherein the plurality of stacked FET transistors are connected in series, such that drain and source regions of at least some adjacent pairs of stacked FET transistors are connected to one another.

16. A communication system for communication over a plurality of frequency bands, the communication system comprising the amplifier circuit of claim 1.

17. The communication system of claim 16, wherein the plurality of frequency bands span over a frequency range from about 1 GHz to about 20 GHz.

18. The communication system of claim 16, wherein the plurality of frequency bands span over a frequency range from about 1 GHz to about 100 GHz.

19. A differential amplifier, comprising:

a first amplification path for amplifying a positive component (IN+) of a differential input signal (IN+, IN−); and a second amplification path for amplifying a negative component (IN−) of the differential input signal (IN+, IN−), wherein each of the first and the second amplification paths comprises an amplifier circuit according to claim 1.

* * * * *